United States Patent
Kim et al.

(10) Patent No.: US 8,281,217 B2
(45) Date of Patent: Oct. 2, 2012

(54) MEMORY DEVICES AND ENCODING AND/OR DECODING METHODS

(75) Inventors: Yong June Kim, Seoul (KR); Jae Hong Kim, Seoul (KR); Jun Jin Kong, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 874 days.

(21) Appl. No.: 12/379,746

(22) Filed: Feb. 27, 2009

(65) Prior Publication Data

US 2009/0241008 A1    Sep. 24, 2009

(30) Foreign Application Priority Data

Mar. 18, 2008   (KR) .................. 10-2008-0024930

(51) Int. Cl.
*G11C 29/00*    (2006.01)
(52) U.S. Cl. .................. 714/763; 714/755; 714/786
(58) Field of Classification Search .................. 714/755, 714/786, 763
See application file for complete search history.

(56) References Cited

U.S. PATENT DOCUMENTS

| | | | |
|---|---|---|---|
| 5,742,619 A | 4/1998 | Hassan | |
| 6,320,850 B1 | 11/2001 | Perahia et al. | |
| 6,718,502 B1 | 4/2004 | Kuznetsov et al. | |
| 6,870,233 B2* | 3/2005 | Chen et al. | 257/390 |
| 7,205,912 B1 | 4/2007 | Yang et al. | |
| 2003/0088823 A1* | 5/2003 | Miyauchi et al. | 714/795 |

FOREIGN PATENT DOCUMENTS

| | | |
|---|---|---|
| JP | 03-135116 | 6/1991 |
| KR | 10-2005-0119595 | 12/2005 |
| KR | 10-2006-0052488 | 5/2006 |

* cited by examiner

*Primary Examiner* — Guy Lamarre

(74) *Attorney, Agent, or Firm* — Harness, Dickey & Pierce, P.L.C.

(57) ABSTRACT

Memory devices and/or encoding/decoding methods are provided. A memory device may include: a memory cell array; an internal decoder configured to apply, to a first codeword read from the memory cell array, a first decoding scheme selected based on a characteristic of a first channel in which the first codeword is read to perform error control codes (ECC) decoding of the first codeword, and apply, to a second codeword read from the memory cell array, a second decoding scheme selected based on a characteristic of a second channel in which the second codeword is read to perform the ECC decoding of the second codeword; and an external decoder configured to apply an external decoding scheme to the ECC-decoded first codeword and the ECC-decoded second codeword to perform the ECC decoding of the first codeword and the second codeword.

21 Claims, 9 Drawing Sheets

MEMORY DEVICES AND ENCODING AND/OR DECODING METHODS

PRIORITY STATEMENT

This application claims priority from Korean Patent Application No. 10-2008-0024930, filed on Mar. 18, 2008, in the Korean Intellectual Property Office (KIPO), the entire contents of which are incorporated herein by reference.

BACKGROUND

1. Field

Example embodiments relate to error control codes (ECC). Also, example embodiments relate to ECC encoding/decoding methods for memory devices.

2. Description of Related Art

Generally, a path for transmitting information may be referred to as a channel. When information is transmitted using wired communication, the channel may be a transmission line transmitting the information, and when information is transmitted using wireless communication, the channel may be air passing electromagnetic waves with the information.

Also, a process of storing information in a storage device and reading the stored information from the storage device may be the channel. The channel may be a temporal lapse from storing of the information until reading of the information, and may also be a physical path of storing information in the storage device and reading the stored information from the storage device.

While information is being transmitted via the channel, the information may be corrupted. The corrupted information may include an error and thus research is being actively conducted on apparatuses and methods of detecting the error from the corrupted information and eliminating the detected error to restore initial information.

A process of adding error control codes or error control coding or error correction codes (ECC) to the initial information prior to transmitting the information to generate transmission information may be referred to as ECC encoding, and a process of separating added information and the initial information from the received transmission information after receiving the transmission information to restore the initial information may be referred to as ECC decoding.

Depending on channel characteristics, an error rate in the channel may be high. As the error rate increases, a code rate of the ECC to overcome the error and achieve the desired performance may decrease or hardware complexity to embody an encoding and decoding method may increase.

SUMMARY

Example embodiments may provide apparatuses and/or methods that may apply a new error control codes or error control coding or error correction codes (ECC) encoding and/or decoding scheme to memory devices, thereby reducing an error when reading/writing data of the memory devices.

Example embodiments may also provide apparatuses and/or methods that may apply a new ECC encoding and/or decoding scheme to multi-level cell (MLC) memory devices or multi-bit cell (MBC) memory devices, thereby reducing an error rate of a critical data page.

According to example embodiments, a memory device may include: a memory cell array, an internal decoder, and an external decoder. The internal decoder may be configured to apply a first decoding scheme to a first codeword read from the memory cell array to perform ECC decoding of the first codeword. The first decoding scheme may be selected based on a characteristic of a first channel in which the first codeword is read by the internal decoder. The internal decoder may be configured to apply a second decoding scheme to a second codeword read from the memory cell array to perform the ECC decoding of the second codeword. The second decoding scheme may be selected based on a characteristic of a second channel in which the second codeword is read by the internal decoder. The external decoder may be configured to apply an external decoding scheme to the ECC-decoded first codeword and the ECC-decoded second codeword to perform the ECC decoding of the ECC-decoded first codeword and the ECC-decoded second codeword.

According to example embodiments, a memory device may include: a memory cell array, an external encoder, an internal encoder, and a programming unit. The external encoder may be configured to apply an external encoding scheme to an input codeword to perform ECC encoding of the input codeword, and to generate an external codeword. The internal encoder may be configured to separate the external codeword into a first codeword and a second codeword. The internal encoder may be configured to apply the first encoding scheme to the first codeword to perform the ECC encoding of the first codeword, and to apply the second encoding scheme to the second codeword to perform the ECC encoding of the second codeword. The internal encoder may select a first encoding scheme based on a characteristic of a first channel which is associated with the first codeword, and to select a second encoding scheme based on a characteristic of a second channel which is associated with the second codeword. The programming unit may be configured to store the ECC-encoded first codeword and the ECC-encoded second codeword in the memory cell array.

According to example embodiments, a decoding method of a concatenated decoder including an internal decoder and an external decoder may include: selecting a first decoding scheme based on a characteristic of a first channel; applying the first decoding scheme to a first codeword received through the first channel to perform ECC decoding of the first codeword; selecting a second decoding scheme based on a characteristic of a second channel; applying the second decoding scheme to a second codeword received through the second channel to perform the ECC decoding of the second codeword; and applying an external decoding scheme to the ECC-decoded first codeword and the ECC-decoded second codeword to perform the ECC decoding of the first codeword and the second codeword.

According to example embodiments, an encoding method may include: applying an external encoding scheme to an input codeword to perform ECC encoding of the input codeword, and generating an external codeword; separating the external codeword into a first codeword and a second codeword; selecting a first encoding scheme based on a characteristic of a first channel in which the first codeword is stored; applying the first encoding scheme to the first codeword to perform the ECC encoding of the first codeword; selecting a second encoding scheme based on a characteristic of a second channel in which the second codeword is stored; and applying the second encoding scheme to the second codeword to perform the ECC encoding of the second codeword.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
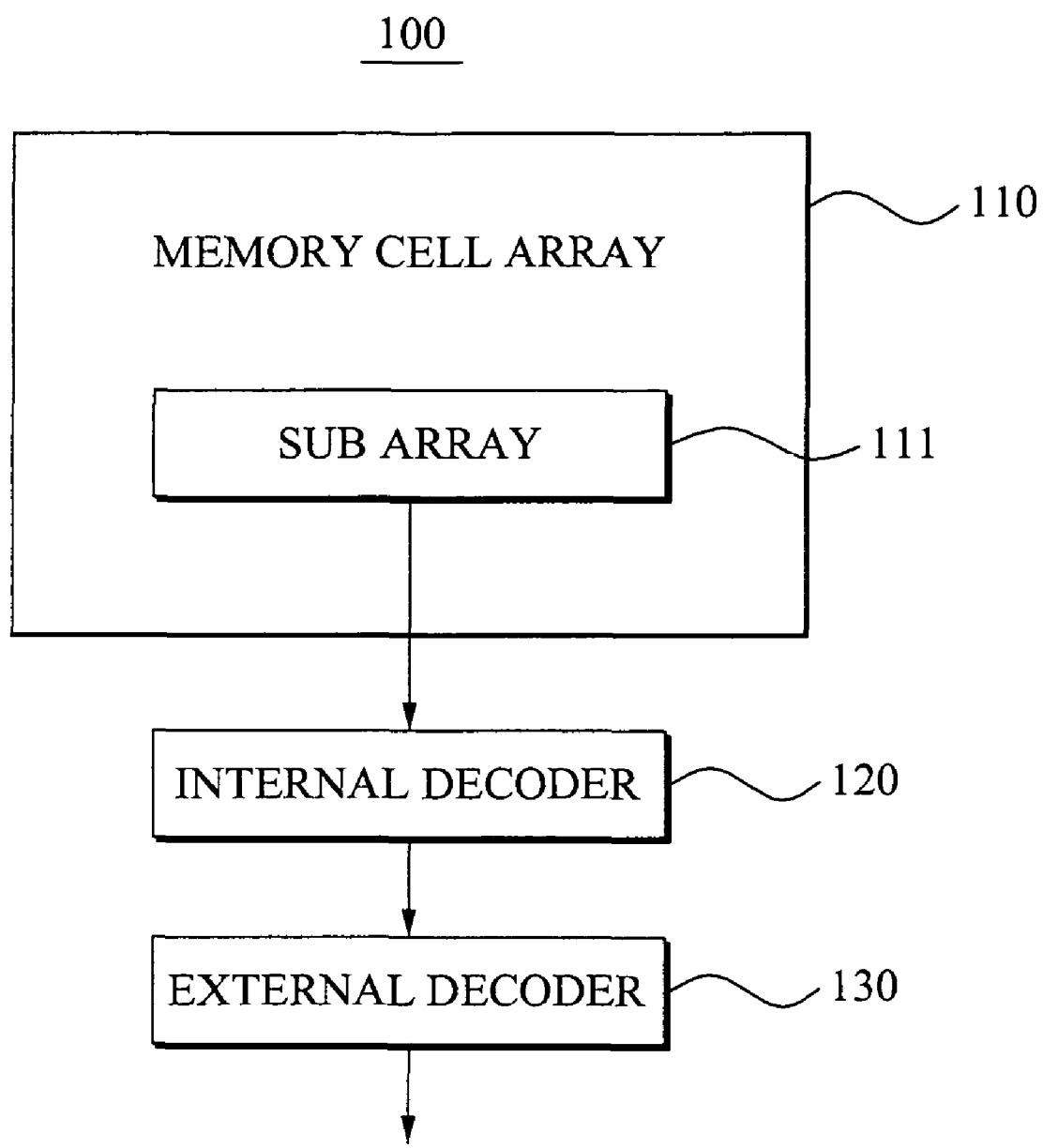
FIG. 1 is a diagram illustrating a memory device according to example embodiments.

Detailed example embodiments are disclosed herein. However, specific structural and functional details disclosed herein are merely representative for purposes of describing example embodiments. Example embodiments may, however, may be embodied in many alternate forms and should not be construed as being limited to only the embodiments set forth herein.

Accordingly, while example embodiments are capable of various modifications and alternate forms, embodiments thereof are shown by way of example in the drawings and will herein be described in detail. It should be understood, however, that there is not intent to limit example embodiments to the particular forms disclosed, but to the contrary, example embodiments are to cover all modifications, equivalents, and alternatives falling within the scope of the example embodiments. Like numbers refer to like elements throughout the description of the figures.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Reference will now be made to example embodiments, which are illustrated in the accompanying drawings, wherein like reference numerals may refer to like components throughout.

FIG. 1 illustrates a memory device 100 according to example embodiments.

Referring to FIG. 1, the memory device 100 may include a memory cell array 110, an internal decoder 120, and an external decoder 130.

The memory cell array 110 may include a plurality of memory cells. A sub array 111 included in the memory cell array 110 may be a set of memory cells which are simultaneously read by the internal decoder 120. Simultaneously, the internal decoder 120 may read data from the memory cells of the sub array 111.

According to example embodiments, the sub array 111 may be a set of memory cells connected with a single word line. The memory device 100 may simultaneously read the data from the memory cells in the sub array 111 by applying a specific voltage to the word line connected with the sub array 111. According to example embodiments, the sub array 111 being the set of the memory cells connected with the single word line may be shown as a page.

The internal decoder 120 may apply a first decoding scheme to a first codeword read from the sub array 111 to perform error control codes or error control coding or error correction codes (ECC) decoding of the first codeword. The first decoding scheme may be selected based on a characteristic of a first channel from which the first codeword is read by the internal decoder 120.

The internal decoder 120 may apply a second decoding scheme to a second codeword read from the sub array 111 to perform the ECC decoding of the second codeword. The second decoding scheme may be selected based on a characteristic of a second channel from which the second codeword is read by the internal decoder 120.

The external decoder 130 may apply an external decoding scheme to the ECC-decoded first codeword and the ECC-decoded second codeword to perform the ECC decoding of the first codeword and the second codeword.

The external decoding scheme may be a scheme of correcting all errors of the ECC-decoded first codeword and the ECC-decoded second codeword when a number of errors of the ECC-decoded first codeword and the ECC-decoded second codeword is less than or equal to an error correcting capability.

According to example embodiments, the external decoding scheme may be a decoding scheme of enabling an error rate of an output codeword to be less than or equal to a target error rate when an error rate of an input codeword is less than or equal to a threshold error rate. The threshold error rate may denote the error rate of the input codeword necessary to enable the error rate of the output codeword of the external decoder 130 to be less than or equal to the target error rate.

As examples of codes whose error correcting capability is explicitly shown, there are block codes and the like. As examples of the block codes, there are Bose, Ray-Chaudhuri, Hocquenghem (BCH) codes, Reed-Solomon (RS) codes, and the like, and as examples of decoding schemes for the block codes, there are a Meggitt decoding scheme, a Berlekamp-Massey decoding scheme, and an Euclid decoding scheme, and the like.

The internal decoder 120 may select the first decoding scheme and the second decoding scheme to enable a sum of a number of errors of the ECC-decoded first codeword and a number of errors of the ECC-decoded second codeword to be less than or equal to the error correcting capability of the external decoder 130 based on the characteristic of the first channel and the second channel.

The internal decoder 120 may select the first decoding scheme to enable the error rate of the ECC-decoded first codeword to be less than or equal to the threshold error rate based on the characteristic of the first channel.

The internal decoder 120 may select the second decoding scheme to enable the error rate of the ECC-decoded second codeword to be less than or equal to the threshold error rate based on the characteristic of the second channel.

When the error correcting capability of the external decoder 130 is predetermined, the internal decoder 120 may select the first decoding scheme and the second decoding scheme based on the predetermined error correcting capability. If the external decoder 130 receives the ECC-decoded first codeword and the ECC-decoded second codeword that include the sufficiently low error rate, the external decoder 130 may correct all errors of the ECC-decoded first codeword and the ECC-decoded second codeword based on the external decoding scheme.

According to example embodiments, it is possible to embody an encoding scheme and/or a decoding scheme of determining the decoding scheme of the internal decoder 120 based on performance of the external decoder 130, thereby improving error correctability.

A single-level cell (SLC) memory device may store data of one bit in a single memory cell. The SLC memory may be referred to as a single-bit cell (SBC) memory. A process of storing the data of one bit in a single-level cell of the SLC memory may be referred to as a programming process, and changes a threshold voltage of the single-level cell. Depending on whether the data of one bit being stored in the single-level cell is "0" or "1", a memory of the single-level cell may have a high threshold voltage level or a low threshold voltage level. A process of reading the data stored in the single-level cell is performed by sensing the threshold voltage in the single-level cell and by determining whether the sensed threshold voltage is higher or lower than a reference voltage level or a read voltage level.

When the memory device 100 applies a specific voltage associated with the read voltage level to the word line with which the memory cells of the sub array 111 are connected, a current flowing in each bit line connected with each memory cell may be determined based on whether the threshold voltage level of each memory cell of the sub array 111 is higher or lower than the read voltage level. The internal decoder 120 may sense the current flowing in each bit line connected with each memory cell of the sub array 111, and may determine a range of the threshold voltage level in each memory cell of the sub array 111 based on a level of the sensed current.

The threshold voltage of each single-level cell may have a distribution within a certain range due to a minute electrical difference between each single-level cell. For example, when the sensed threshold voltage of the single-bit cell ranges from 0.5 volts to 1.5 volts, the data stored in the single-bit cell may be determined as logic "1." When the sensed threshold voltage of the single-bit cell ranges from 2.5 volts to 3.5 volts, the data stored in the single-bit cell may be determined as logic "0."

Meanwhile, a multi-level cell (MLC) memory device that can store data of two or more bits in a single memory cell has been proposed in response to a need for higher integration of memory. The MLC memory device may also be referred to as a multi-bit cell (MBC) memory. However, as the number of bits stored in the single memory cell increases, reliability may deteriorate and the read failure rate may increase. When the single memory cell stores data of 'm' bits, the threshold voltage level formed in the single memory cell may be any one of $2^m$ voltage levels. Due to a minute electrical difference between each memory cell, when each memory cell stores the data of 'm' bits, the threshold voltage levels of the memory cells may form $2^m$ distributions.

Since a voltage window of the memory is limited, a threshold voltage difference between adjacent distributions may decrease as 'm' increases and the adjacent distributions may be overlapped with each other as 'm' increases more. When the adjacent distributions are overlapped with each other, the read failure rate of the data read from in the memory cells may increase.

An ECC encoding and/or ECC decoding scheme may be applied to an MLC memory in order to store data in the MLC memory, to detect an error occurring while reading the data from the MLC memory, and to correct the detected error.

The memory cell array 110 may include a plurality of multi-bit cells capable of storing multi-bit data. The internal decoder 120 may read the second codeword from the multi-bit cells where the first codeword is read.

The first codeword and the second codeword may be the data stored in the multi-bit cells of the sub array 111. The first codeword and the second codeword may correspond to the data stored in the same multi-bit cells, however the first codeword and the second codeword may correspond to data forming different bit layers. For example, the internal decoder 120 may read the first codeword forming a bit layer of a most significant bit (MSB) from the multi-bit cells of the sub array 111, and may read the second codeword forming a bit layer of a least significant bit (LSB) from the multi-bit cells of the sub array 111.

When the multi-bit cells store four-bit data, four bit layers may exist. When the bit layer of the MSB is a first bit layer, and when the bit layer of the LSB is a fourth bit layer, the internal decoder 120 may read data forming the first bit layer as the first codeword, and may read data forming the second bit layer as the second codeword. The internal decoder 120 may select the first decoding scheme corresponding to the first codeword based on the characteristic of the first channel, and may select the second decoding scheme corresponding to the second codeword based on the characteristic of the second channel.

According to example embodiments, the internal decoder 120 may read data forming the first bit layer as the first codeword, may read data forming the second bit layer as the second codeword, may read data forming a third bit layer as a third codeword, and may read data forming the fourth bit layer as a fourth codeword. According to example embodiments, the internal decoder 120 may select the first decoding scheme to perform the ECC decoding of the first codeword and the second codeword, and may select the second decoding scheme to perform the ECC decoding of the third codeword and the fourth codeword. According to example embodiments, the internal decoder 120 may select the first decoding scheme to perform the ECC decoding of the first codeword, may select the second decoding scheme to perform the ECC decoding of the second codeword, may select a third decoding scheme to perform the ECC decoding of the third codeword, and may select a fourth decoding scheme to perform the ECC decoding of the fourth codeword.

According to example embodiments, the first decoding scheme may be a decoding scheme using low density parity check (LDPC) codes, and the second decoding scheme may be a decoding scheme using Convolutional codes. The second decoding scheme may be a decoding scheme of a different type from the first decoding scheme. As Examples of ECC types being applicable to the memory device 100, may include LDPC codes (Repeat Accumulate (RA), zigzag), Convolutional codes, Recursive Systematic Convolutional (RSC) codes, Turbo codes, BCH codes, RS codes, Goppa codes, Reed-Muller (RM) codes, and the like.

According to example embodiments, the first decoding scheme and the second decoding scheme may be decoding schemes of the same type and may be the decoding schemes in which a size of redundant information added to a message is different from each other. Examples of the redundant information may include parity.

According to example embodiments, the first decoding scheme and the second decoding scheme may be decoding schemes of the same type and may be the decoding schemes in which a code rate added to the message is different from each other. A length of the first codeword may be the same as a length of the second codeword, and the code rate of the first codeword may be different from the code rate of the second codeword. The length of the first codeword may be different from the length of the second codeword, and the code rate of the first codeword may be different from the code rate of the second codeword.

According to example embodiments, the first decoding scheme and the second decoding scheme may be decoding schemes of the same type, and may adjust performance of a code using one or more of an extending scheme, a shortening scheme, a puncturing scheme, and the like.

Data forming a bit layer is referred to as forming a page. In the present specification, the set of the multi-bit cells, which are connected with the single word line, is referred to as a memory page, and data which is stored in multi-bit cells of a single memory page and forms a single bit layer is referred to as a data page. The terms are for convenience of description, and the scope of example embodiments should not be construed as being limited by the use of the terms.

According to example embodiments, data values may be assigned to threshold voltages so that the bit layer corresponding to the MSB may experience transition once with respect to a change of threshold voltages of the multi-bit cells. The transition may be defined as an event in which a value of data of the bit layer changes from "1" to "0" or "0" to "1" with respect to adjacent threshold voltages. In the bit layer corresponding to the MSB, "1" may be determined as being stored in the multi-bit cells having a lower threshold voltage than the read voltage level, and "0" may be determined as being stored in the multi-bit cells having a higher threshold voltage than the read voltage level. According to example embodiments, data values may be assigned to threshold voltages so that the bit layer corresponding to the LSB may experience transitions of $2^{(m-1)}$ times with respect to the change of threshold voltages of the multi-bit cells. To determine data of the bit layer corresponding to the LSB, $2^{(m-1)}$ read voltage levels may be required.

According to example embodiments, the sub array 111 may correspond to a single data page, the first codeword may correspond to a first data page forming the bit layer of the MSB, and the second codeword may correspond to a second data page forming the bit layer of the LSB. The first channel may correspond to a process of reading the first data page using a single read voltage level, and the second channel may correspond to a process of reading the second data page using $2^{(m-1)}$ read voltage levels. As a number of transitions experienced by the bit layer increases, a probability that an error occurs in a channel corresponding to the bit layer increases. Since the bit layer of the LSB experiences more transitions than the bit layer of the MSB, a probability that the error occurs in the second channel may be higher than a probability that the error occurs in the first channel. The internal decoder 120 may use the second decoding scheme of correcting more errors than errors corrected by the first decoding scheme.

According to example embodiments, the decoding scheme corresponding to the channel may be determined according to the bit layer of the multi-bit cell, thereby embodying an ECC decoding scheme optimized for a channel characteristic changing according to the bit layer of the multi-bit cell. According to example embodiments, it is possible to improve error correctability of a critical page having the highest probability that the error occurs.

The internal decoder 120 may combine the ECC-decoded first codeword and the ECC-decoded second codeword to generate a long codeword. The external decoder 130 may apply the external decoding scheme to the long codeword to perform the ECC decoding of the long codeword. According to example embodiments, the memory device 100 may generate the long codeword, thereby transmitting data to an external host or a processor (not shown) regardless of the bit layer. The external host or the processor may process the data regardless of a physical characteristic of the memory device 100, and access the memory device 100 using a logical address eliminating a need for considering a physical address.

According to example embodiments, the internal decoder 120 may include a first internal decoding module (not shown) corresponding to the first decoding scheme and a second internal decoding module (not shown) corresponding to the second decoding scheme. The first internal decoding module may perform the ECC decoding of the first codeword, and the second internal decoding module may perform the ECC decoding of the second codeword. Each internal decoding module may reduce hardware complexity since each internal decoding module forms a simple data path. A decoding process using a plurality of decoding modules will be described in detail by referring to FIG. 3.

Figure 2:
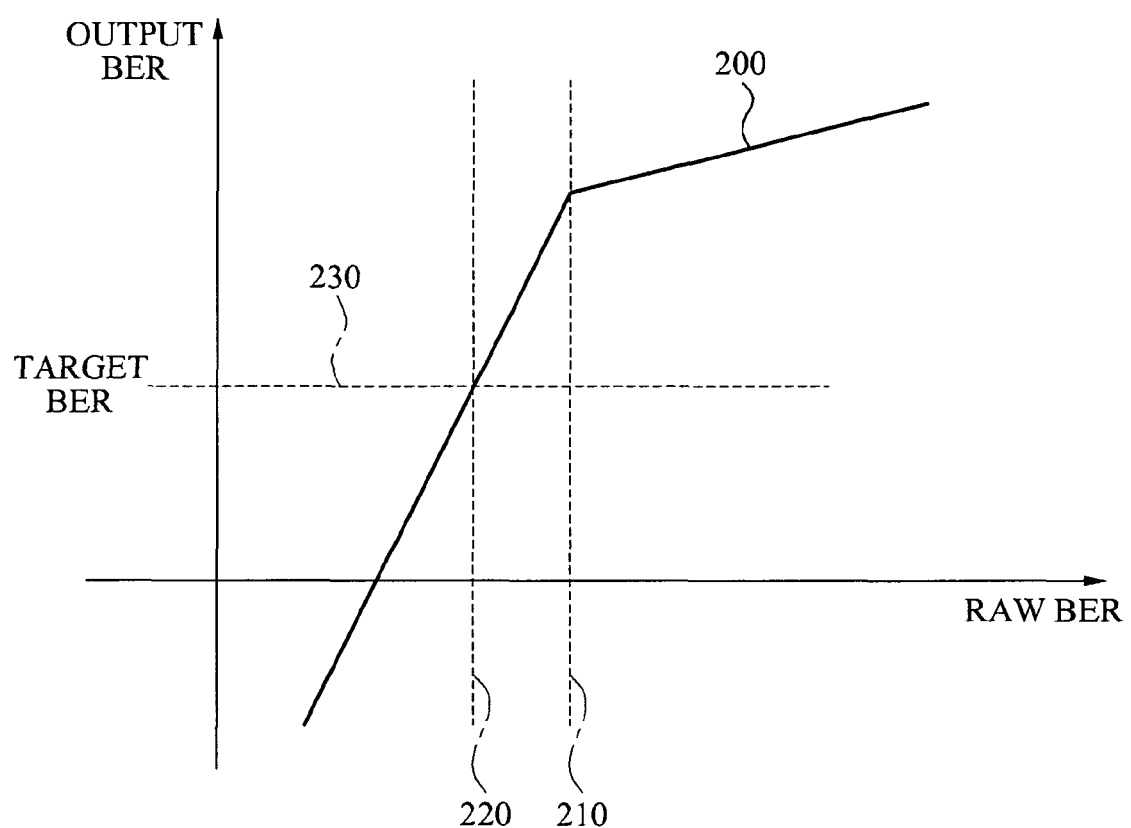
FIG. 2 is a graph illustrating error correcting capability of an external decoder of FIG. 1.

FIG. 2 is a graph illustrating error correcting capability of the external decoder 130 of FIG. 1.

Referring to FIG. 2, a horizontal axis denotes a bit error rate (BER) of a codeword inputted in the external decoder 130, and a vertical axis denotes a BER of an output codeword being ECC-decoded by the external decoder 130.

A graph 200 illustrates a relation between the BER of the codeword inputted in the external decoder 130 and the BER of the output codeword of the external decoder 130, the output codeword being ECC-decoded by the external decoder 130.

The BER of the input codeword is referred to as a raw BER. When the raw BER increases, an output BER of the output codeword of the external decoder 130 may increase. According to the graph 200, when the raw BER of the codeword inputted in the external decoder 130 is reduced to be less than or equal to a BER 210, the output BER of the output codeword of the external decoder 130 may rapidly decrease. A region of the raw BER that corresponds to rapid reduction of the BER of the output codeword is referred to as a waterfall region. The region in which the raw BER is less than or equal to the BER 210 may be referred to as the waterfall region in FIG. 2. When the raw BER is less than or equal to the BER 210, the external decoder 130 may effectively reduce the BER of the input codeword.

The external decoder 130 may select a BER 230 being any one of output BERs corresponding to the waterfall region as a target BER. When the raw BER of the codeword inputted in the external decoder 130 is less than or equal to a BER 220, the external decoder 130 may reduce the output BER of the output codeword to be less than or equal to the target BER. The raw BER to enable the output BER to be less than or equal to the target BER, that is, the BER 220, may be referred to as a threshold BER.

The internal decoder 120 may reduce the BER of the ECC-decoded first codeword to be less than or equal to the threshold BER for effective error correction of the external decoder 130, the BER of the ECC-decoded first codeword corresponding to the raw BER of the external decoder 130. The internal decoder 120 may reduce the BER of the ECC-decoded second codeword to be less than or equal to the threshold BER for effective error correction of the external decoder 130.

The internal decoder 120 may select the first decoding scheme to enable the BER of the ECC-decoded first codeword to be less than the BER 210, and may select the second decoding scheme to enable the BER of the ECC-decoded second codeword to be less than the BER 210.

According to example embodiments, the internal decoder 120 may select the first decoding scheme and the second decoding scheme to enable the BER of the ECC-decoded first codeword and the ECC-decoded second codeword to be the same or substantially the same. The internal decoder 120 may select the first decoding scheme and the second decoding scheme to enable the BER of the ECC-decoded first codeword and the ECC-decoded second codeword to be substantially the same and be less than the BER 210.

According to example embodiments, it is possible to adjust the BER of the ECC-decoded first codeword and the BER of the ECC-decoded second codeword based on the predetermined performance of the external decoder 130, thereby reducing hardware complexity for the ECC decoding and improving error correctability.

According to example embodiments, it is possible to adjust the BER of the ECC-decoded first codeword and the BER of the ECC-decoded second codeword to be substantially the same, thereby optimizing or improving performance of the external ECC.

According to example embodiments, it is possible to adjust the BER of the ECC-decoded first codeword and the BER of the ECC-decoded second codeword to be substantially the same, thereby maximizing or increasing the code rate for the ECC decoding.

According to example embodiments, it is possible to adjust the BER of the ECC-decoded first codeword and the BER of the ECC-decoded second codeword to be substantially the same, thereby minimizing or decreasing hardware complexity for the ECC decoding.

According to example embodiments, it is possible to adjust the BER of the ECC-decoded first codeword and the BER of the ECC-decoded second codeword to be substantially the same, in order to transmit an ECC-decoded codeword to the external host or the processor regardless of the bit layer of the multi-bit cell.

Figure 3:
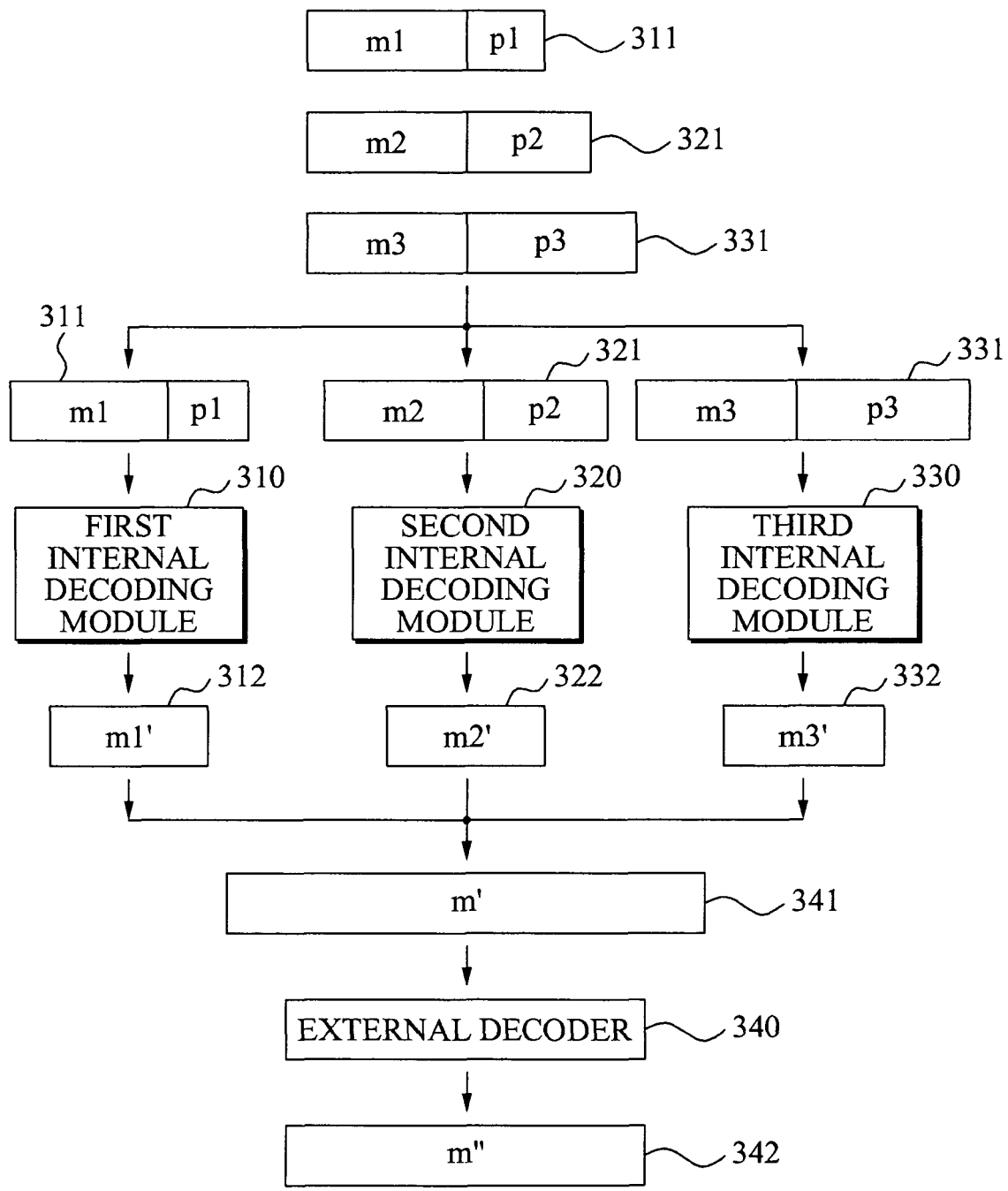
FIG. 3 is a diagram illustrating an error control codes (ECC) decoding method according to example embodiments.

FIG. 3 is a diagram illustrating an ECC decoding method according to example embodiments Referring to FIG. 3, the ECC decoding method may be performed by three internal decoding modules 310, 320, and 330, and an external decoder 340.

A first codeword 311 may include a message m1 and a parity p1. The message m1 and the parity p1 may correspond to a first data page read from a multi-bit cell array (not shown). The message m1 and the parity p1 may include an error.

A second codeword 321 may include a message m2 and a parity p2. The message m2 and the parity p2 may correspond to a second data page read from the multi-bit cell array. The message m2 and the parity p2 may include an error.

A third codeword 331 may include a message m3 and a parity p3. The message m3 and the parity p3 may correspond to a third data page read from the multi-bit cell array. The message m3 and the parity p3 may include an error.

A length or number of bits in a parity included in a codeword while storing data may correspond to an estimated data rate of the data page associated with the codeword. For example, as FIG. 3 illustrates, since an error rate of the third data page is estimated to be higher than an error rate of the second data page, and the error rate of the second data page is estimated to be higher than an error rate of the first data page, the parity p2 being longer than the parity p1 of the first codeword 311 may be included in the second codeword 321 while storing data. Similarly, the parity p3 being longer than the parity p2 of the second codeword 321 may be included in the third codeword 331. According to example embodiments, when lengths of the first codeword, the second codeword, and the third codeword are the same, a code rate of the first codeword may be greater than or equal to a code rate of the second codeword, and the code rate of the second codeword may be greater than or equal to a code rate of the third codeword.

The first internal decoding module 310 may perform ECC decoding of the first codeword 311. The first internal decoding module 310 may estimate the message m1 from the message m1 and the parity p1 of the first codeword 311. The first internal decoding module 310 may estimate the message m1 and generate an estimated message m1' 312.

The second internal decoding module 320 may perform the ECC decoding of the second codeword 321. The second internal decoding module 320 may estimate the message m2 from the message m2 and the parity p2 of the second codeword 321. The second internal decoding module 320 may estimate the message m2 and generate an estimated message m2' 322.

The third internal decoding module 330 may perform the ECC decoding of the third codeword 331. The third internal decoding module 330 may estimate the message m3 from the message m3 and the parity p3 of the third codeword 331. The third internal decoding module 330 may estimate the message m3 and generate an estimated message m3' 332.

An internal decoder (not shown) including the first internal decoding module 310, the second internal decoding module 320, and the third internal decoding module 330 may combine the estimate message m1' 312, the estimate message m2' 322, and the estimate message m3' 332, and generate a long codeword m' 341. According to example embodiments, the external decoder 340 may combine the estimate message m1' 312, the estimate message m2' 322, and the estimate message m3' 332, and may generate the long codeword m' 341.

The external decoder 340 may perform the ECC decoding of the long codeword m' 341 and generate an output message m" 342.

Figure 4:
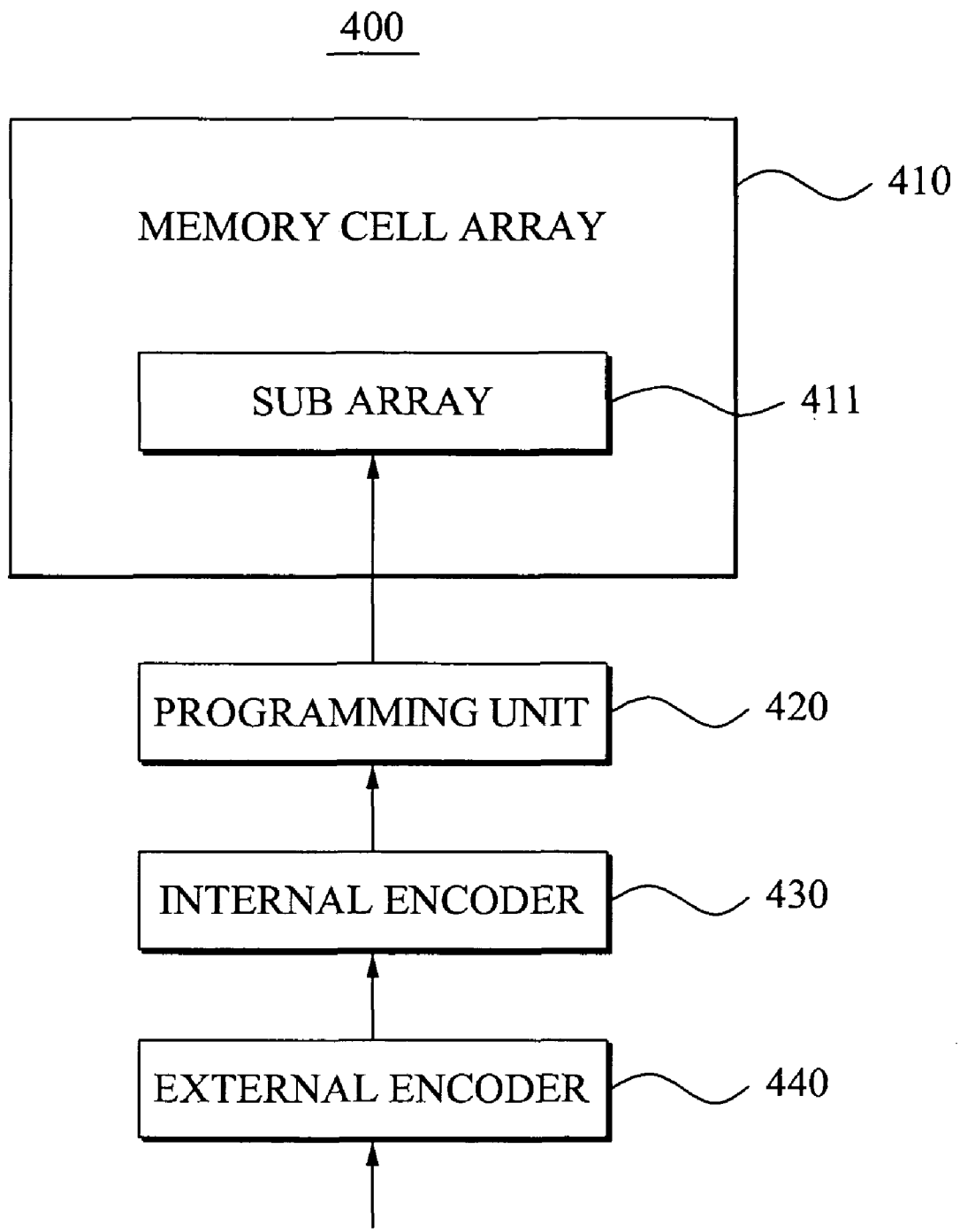
FIG. 4 is a diagram illustrating another memory device according to example embodiments.

FIG. 4 is a diagram illustrating another memory device 400 according to example embodiments.

Referring to FIG. 4, the memory device 400 includes a memory cell array 410, a programming unit 420, an internal encoder 430, and an external encoder 440.

The memory cell array 410 includes a sub array 411. The sub array 411 may be a set of memory cells which are simultaneously programmed by the programming unit 420. The sub array 411 may be a set of memory cells connected with a single word line.

The external encoder 440 may apply an external encoding scheme to an input codeword to perform ECC encoding of the input codeword, and may generate an external codeword.

The internal encoder 430 may separate the external codeword into a first codeword and a second codeword. The internal encoder 430 may select a first encoding scheme based on a characteristic of a first channel, and may select a second encoding scheme based on a characteristic of a second channel. The first channel corresponds to a path in which the first codeword is stored in the sub array 411, and the second channel corresponds to a path in which the second codeword is stored in the sub array 411. The internal encoder 430 may apply the first encoding scheme to the first codeword to perform the ECC encoding of the first codeword, and may apply the second encoding scheme to the second codeword to perform the ECC encoding of the second codeword.

The programming unit 420 may store the ECC-encoded first codeword and the ECC-encoded second codeword in the sub array 411.

The codeword being ECC-encoded by an external encoding scheme may be ECC-decoded by an external decoding scheme corresponding to the external encoding scheme. The external decoding scheme may be acquired by inversely performing the external encoding scheme. The external decoding scheme may perform the ECC decoding of the codeword including a number of errors less than or equal to an error correcting capability to correct all errors of the codeword. As described above, there are block codes as a type example of ECC showing the error correcting capability. The block code and a trellis code including a convolutional code, an RSC code, a turbo code, and the like may be used for the external decoding scheme.

The internal decoder 430 may select the first encoding scheme based on the characteristic of the first channel and the error correcting capability of the external decoding scheme. The internal decoder 430 may estimate an error rate of the codeword passing through the first channel based on the characteristic of the first channel. The internal decoder 430 may set a first decoding scheme to enable the estimated error rate of the codeword passing through the first channel to be less than or equal to a threshold error rate, and may select the first encoding scheme corresponding to the set first decoding scheme. When the estimated error rate of the codeword passing through the first channel is less than or equal to the threshold error rate, the error rate of the codeword being ECC-decoded by the set first decoding scheme may be reduced to be less than or equal to a target error rate.

The internal encoder 430 may select the second encoding scheme based on the characteristic of the second channel and the error correcting capability of the external decoding scheme. The internal decoder 430 may estimate an error rate of the codeword passing through the second channel based on the characteristic of the second channel. The internal decoder 430 may set a second decoding scheme to enable the estimated error rate of the codeword passing through the second channel to be less than or equal to the threshold error rate, and may select the second encoding scheme corresponding to the set second decoding scheme. When the estimated error rate of the codeword passing through the second channel is less than or equal to the threshold error rate, the error rate of the codeword being ECC-decoded by the set second decoding scheme may be reduced to be less than or equal to the target error rate.

According to example embodiments, the memory cell array 410 may include a plurality of multi-bit cells capable of storing multi-bit data. The programming unit 420 may store the ECC-encoded second codeword in the multi-bit cells which store the ECC-encoded first codeword.

According to example embodiments, the sub array 411 may be a memory page including the multi-bit cells connected with the single word line. The programming unit 420 may store the ECC-encoded first codeword in a bit layer of an MSB of the sub array 411, and may store the ECC-encoded second codeword in a bit layer of an LSB of the sub array 411.

According to example embodiments, each multi-bit cell of the memory cell array 410 may store data of 'm' bits. The bit layer of the MSB of the sub array 411 may correspond to a first bit layer, and the bit layer of the LSB of the sub array 411 may correspond to an $m^{th}$ bit layer. Each multi-bit cell of the sub array 411 may include 'm' bit layers. The programming unit 420 may store the ECC-encoded first codeword in the first bit layer of the sub array 411, and may store the ECC-encoded second codeword in the second bit layer of the sub array 411.

According to example embodiments, each multi-bit cell of the memory cell array 410 may store data of four bits. Each multi-bit cell of the sub array 411 may include four bit layers. The internal encoder 430 may separate the external codeword into a first codeword, a second codeword, a third codeword, and a fourth codeword.

The internal encoder 430 may apply the first encoding scheme to the first codeword to perform the ECC encoding of the first codeword, and may apply the second encoding scheme to the second codeword to perform the ECC encoding of the second codeword. The internal encoder 430 may apply the third encoding scheme to the third codeword to perform the ECC encoding of the third codeword, and may apply the fourth encoding scheme to the fourth codeword to perform the ECC encoding of the fourth codeword.

The programming unit 420 may store the ECC-encoded first codeword in the first bit layer, the first bit layer being the bit layer of the MSB of the sub array 411, and may store the ECC-encoded second codeword in the second bit layer of the sub array 411. The programming unit 420 may store the ECC-encoded third codeword in a third bit layer of the sub array 411, and may store the ECC-encoded fourth codeword in a fourth bit layer, the fourth bit layer being the bit layer of the LSB of the sub array 411.

The first channel may correspond to a process of storing the ECC-encoded first codeword in the first bit layer of the sub array 411, and the second channel may correspond to a process of storing the ECC-encoded second codeword in the second bit layer of the sub array 411. A third channel may correspond to a process of storing the ECC-encoded third codeword in the third bit layer of the sub array 411, and a fourth channel may correspond to a process of storing the ECC-encoded fourth codeword in the fourth bit layer of the sub array 411.

According to example embodiments if the first bit layer corresponds to the MSB, the first bit layer may experience transition once and the second bit layer may experience transition twice. The third bit layer may experience transition four times and the fourth bit layer may experience transition eight times. Since as a number of transitions experienced by the bit layer increases, a probability that an error occurs in a channel corresponding to the bit layer may increase, the fourth channel may be estimated to have the highest probability that the error occurs, based on the characteristic of the fourth channel.

The internal encoder 330 may estimate the probability that the error occurs in each channel based on a number of transitions of each bit layer. A rate of the error occurring in the codeword since the codeword passes through any one of channels may be determined based on the characteristic of the channels. The internal encoder 430 may determine a rate of a message of each channel and redundant information to enable the error rate of the codeword based on the channel to be less than the error correcting capability. As an addition amount of the redundant information with respect to the message of the same size increases, many errors may be corrected. The ratio between the size of the message and the total code size including redundant information may be referred to as a code rate. For example, if a code is 8-bits in size having 2 bits of redundant information and a 6-bit message, the code rate may be 6/8, or 3/4.

Low code rates may be assigned to channels with high error rates and high code rates may be assigned to channels with low error rates. For example, the internal encoder 430 may assign the lowest code rate to the fourth channel, and may assign the code rate being higher than the code rate of the fourth channel to the third channel. The internal encoder 430 may assign the highest code rate to the first channel.

According to example embodiments, it is possible to embody an ECC encoding method of determining an encoding scheme for each channel based on the error correcting capability of the external decoding scheme, thereby adjusting the error rate for each data page of an MBC memory. The code rate may be determined based on the channel.

According to example embodiments, it is possible to adjust the error rate for each data page of the MBC memory, thereby improving error correctability of a critical page including the highest probability that the error occurs.

According to example embodiments, the internal encoder 430 may apply the first encoding scheme to the first channel and the second channel, and may apply the second encoding scheme to the third channel and the fourth channel.

According to example embodiments, the internal encoder 430 may apply an ECC encoding scheme of a different type for each channel. For example, the first encoding scheme may correspond to the ECC encoding scheme using BCH codes, and the second encoding scheme may correspond to the ECC encoding scheme using RS codes.

According to example embodiments, the internal encoder 430 may use the second encoding scheme of the same type as the first encoding scheme, and may adjust performance of codes using extending, shortening, puncturing, and the like.

According to example embodiments, the internal encoder 430 may use the ECC encoding scheme of the different type from the external encoder 440.

According to example embodiments, the internal encoder 430 may select the ECC encoding scheme of the same type as the external encoder 440, and may adjust performance of codes using extending, shortening, puncturing, and the like.

Figure 5:
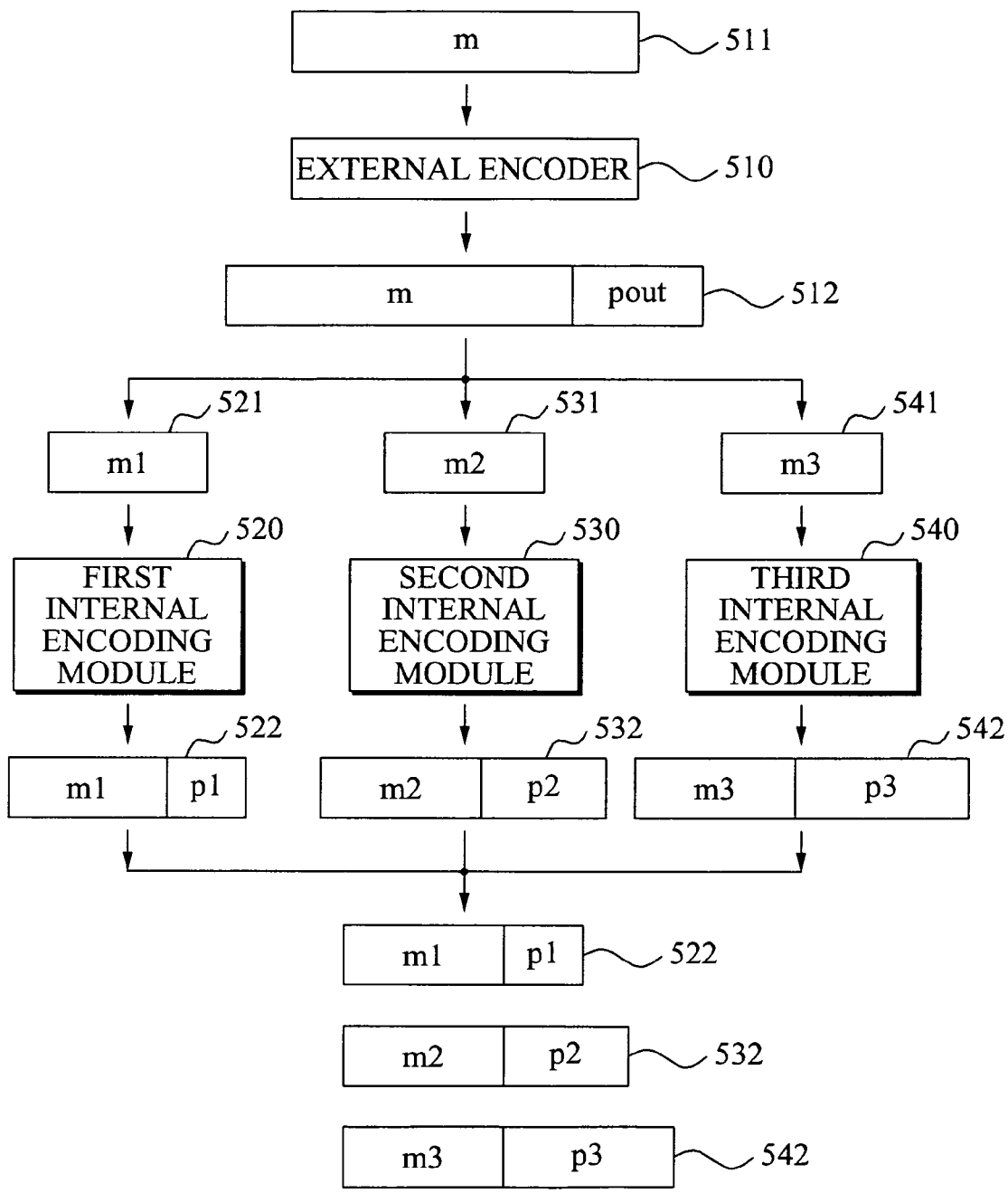
FIG. 5 is a diagram illustrating an ECC encoding method according to example embodiments.

FIG. 5 is a diagram illustrating an ECC encoding method according to example embodiments.

Referring to FIG. 5, the ECC encoding method may be performed by an external encoder 510, a first internal encoding module 520, a second internal encoding module 530, and a third internal encoding module 540.

The external encoder 510 may apply an external encoding scheme to an input message 511 to perform ECC encoding of the input message 511. The external encoder 510 may add an external parity pout to the input message 511 to generate an external codeword 512.

The external encoder 510 may trisect the external codeword 512 to generate a first message 521, a second message 531, and a third message 541.

The first internal encoding module 520 may apply a first encoding scheme to the first message 521 to perform the ECC encoding of the first message 521. The first internal encoding module 520 may add a first parity p1 to the first message 521 to generate a first data page 522. The first data page 522 may be stored in a first bit layer of a memory page (not shown). The first internal encoding module 520 may estimate a rate of an error occurring while storing the first data page 522 to determine the first encoding scheme and a rate of the first message m1 to the first parity p1. The first internal encoding module 520 may determine a length of the first message m1 and a length of the first parity p1.

The second internal encoding module 530 may apply a second encoding scheme to the second message 531 to perform the ECC encoding of the second message 531. The second internal encoding module 530 may add a second parity p2 to the second message 531 to generate a second data page 532. The second data page 532 may be stored in a second bit layer of the memory page. The second internal encoding module 530 may estimate a rate of an error occurring while storing the second data page 532 to determine the second encoding scheme and a rate of the second message m2 to the second parity p2. The second internal encoding module 530 may determine a length of the second message m2 and a length of the second parity p2.

The third internal encoding module 540 may apply a third encoding scheme to the third message 541 to perform the ECC encoding of the third message 541. The third internal encoding module 540 may add a third parity p3 to the third message 541 to generate a third data page 542. The third data page 542 may be stored in a third bit layer of the memory page. The third internal encoding module 540 may estimate a rate of an error occurring while storing the third data page 542 to determine the third encoding scheme and a rate of the third message m3 to the third parity p3. The third internal encoding module 540 may determine a length of the third message m3 and a length of the third parity p3.

If the rate of the error occurring while storing the second data page 532 is estimated to be greater than the rate of the error occurring while storing the first data page 522, the length of the second parity p2 may be set to be greater than the length of the first parity p1 with respect to the message of the same length. Similarly, if the rate of the error occurring while storing the third data page 542 is estimated to be greater than the rate of the error occurring while storing the second data page 532, the length of the third parity p3 may be set to be greater than the length of the second parity p2 with respect to the message of the same length.

If the rate of the error occurring while storing the second data page 532 is estimated to be greater than the rate of the error occurring while storing the first data page 522, a code rate of a first codeword may be set to be higher than a code rate of a second codeword. Similarly, if the rate of the error occurring while storing the third data page 542 is estimated to be greater than the rate of the error occurring while storing the second data page 532, the code rate of the second codeword may be set to be higher than a code rate of a third codeword.

Figure 6:
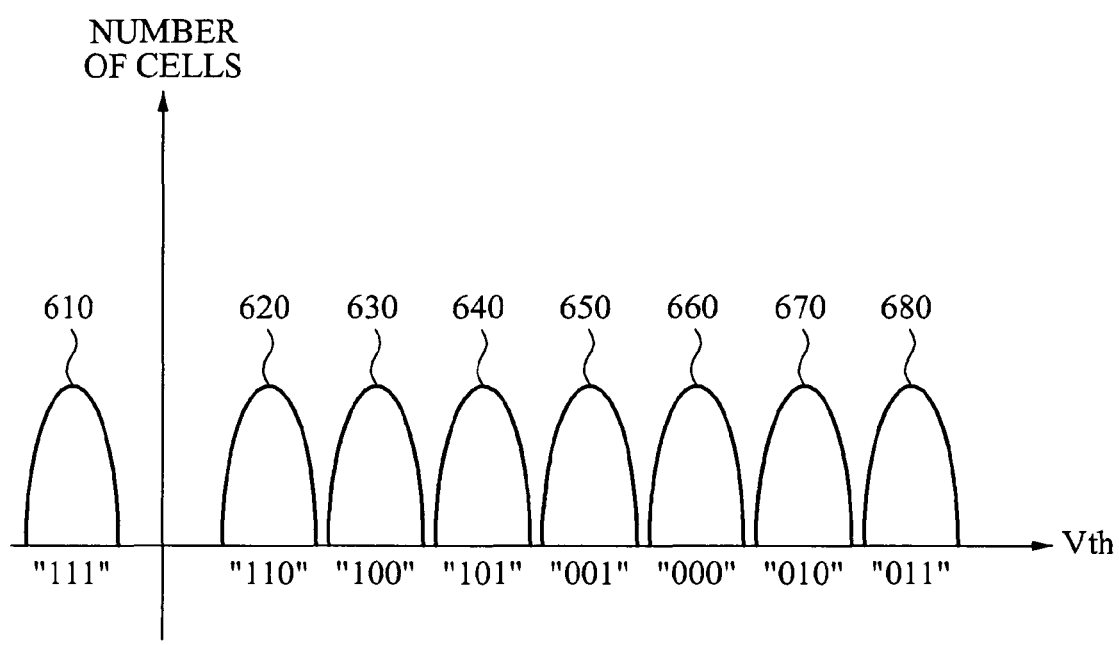
FIG. 6 is a graph illustrating a distribution of threshold voltages of multi-bit cells, which are formed after data pages being generated by the ECC encoding method of FIG. 5 are stored.

FIG. 6 is a graph illustrating a distribution of threshold voltages of multi-bit cells, which are formed after data pages being generated by the ECC encoding method of FIG. 5 are stored.

Referring to FIG. 6, a horizontal axis indicates threshold voltages of multi-bit cells, and a vertical axis indicates a number of the multi-bit cells having corresponding threshold voltages.

A multi-bit cell, in which "0" is stored while a first data page is stored, "1" is stored while a second data page is stored, and "0" is stored while a third data page is stored, stores data "010".

A distribution 610 indicates a distribution of the threshold voltages of the multi-bit cells storing data "111".

A distribution 620 indicates a distribution of the threshold voltages of the multi-bit cells storing data "110".

A distribution 630 indicates a distribution of the threshold voltages of the multi-bit cells storing data "100".

A distribution 640 indicates a distribution of the threshold voltages of the multi-bit cells storing data "101".

A distribution 650 indicates a distribution of the threshold voltages of the multi-bit cells storing data "001".

A distribution 660 indicates a distribution of the threshold voltages of the multi-bit cells storing data "000".

A distribution 670 indicates a distribution of the threshold voltages of the multi-bit cells storing data "010".

A distribution 680 indicates a distribution of the threshold voltages of the multi-bit cells storing data "011".

Figure 7:
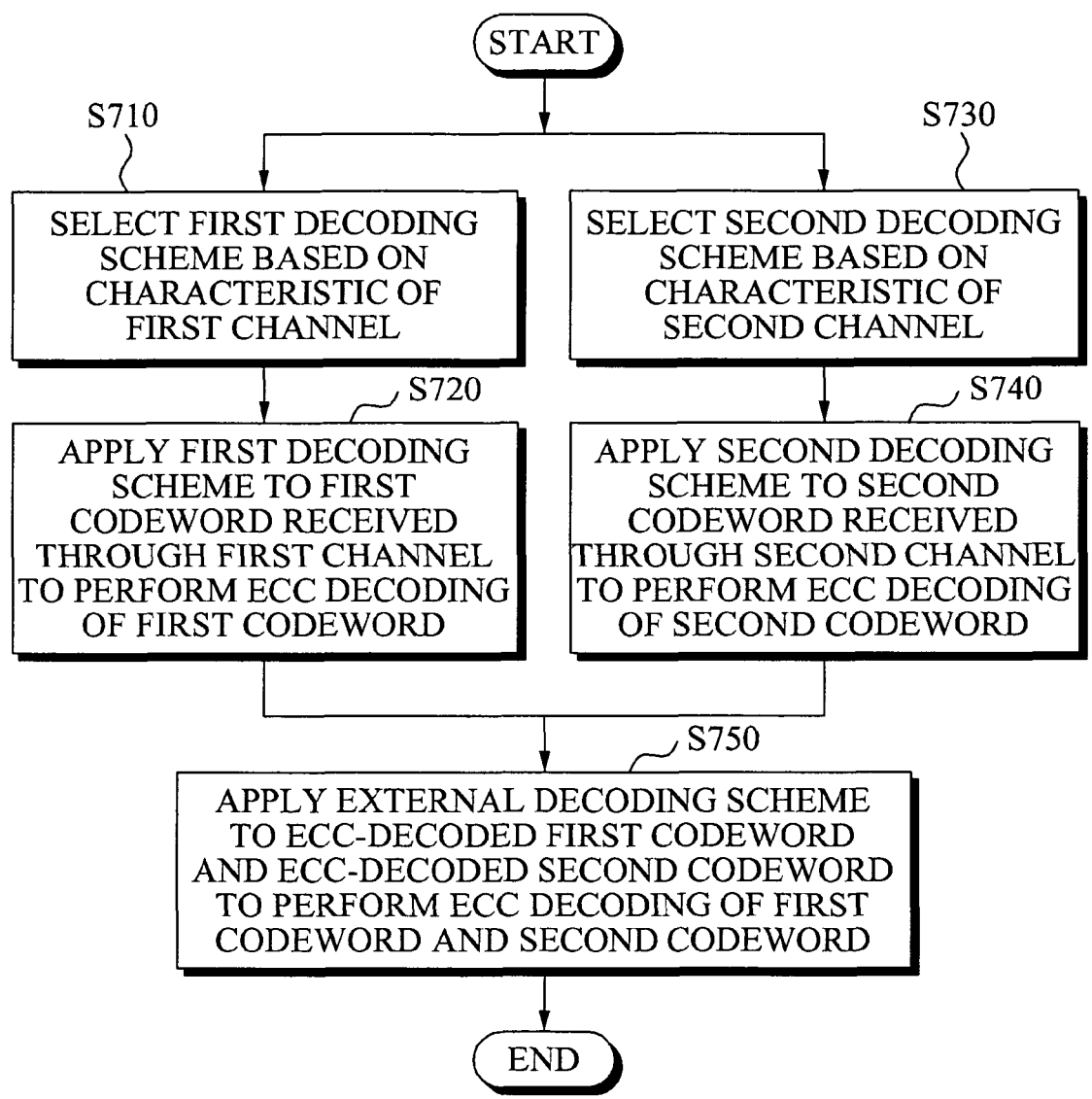
FIG. 7 is a flowchart illustrating a decoding method according to example embodiments.

FIG. 7 is a flowchart illustrating a decoding method according to example embodiments. The decoding method may be a decoding method of a concatenated decoder including an internal decoder and an external decoder.

Referring to FIG. 7, in operation S710, the decoding method may select a first decoding scheme based on a characteristic of a first channel.

In operation S720, the decoding method may apply the first decoding scheme to a first codeword received through the first channel to perform ECC decoding of the first codeword.

In operation S730, the decoding method may select a second decoding scheme based on a characteristic of a second channel.

In operation S740, the decoding method may apply the second decoding scheme to a second codeword received through the second channel to perform the ECC decoding of the second codeword.

In operation S750, the decoding method may apply an external decoding scheme to the ECC-decoded first codeword and the ECC-decoded second codeword to perform the ECC decoding of the first codeword and the second codeword.

Figure 8:
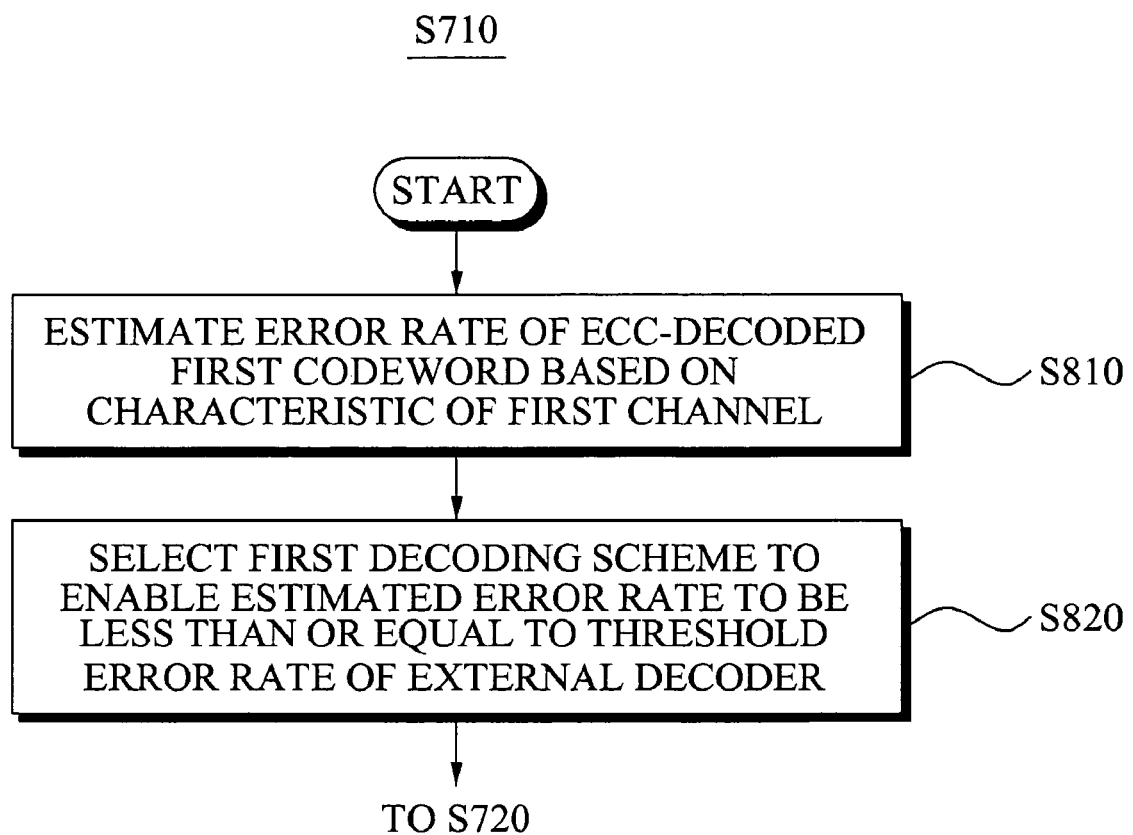
FIG. 8 is a flowchart illustrating selection of a first decoding scheme of FIG. 7.

FIG. 8 is a flowchart illustrating operation S710 of FIG. 7, selection of a first decoding scheme, in greater detail.

Referring to FIG. 8, in operation S810, the decoding method may estimate an error rate of the ECC-decoded first codeword based on the characteristic of the first channel.

According to example embodiments, the decoding method may estimate the error rate of the first codeword based on the characteristic of the first channel, and may estimate the error rate of the first codeword to which a specific decoding scheme is applied and which is ECC-encoded. The error rate of the ECC-encoded first codeword may be estimated to be less than the error rate of the first codeword.

In operation S820, the decoding method may select the first decoding scheme to enable the estimated error rate of the ECC-encoded first codeword to be less than or equal to a threshold error rate of the external decoder. The threshold error rate corresponds to an error rate of an input codeword of the external decoder to enable an error rate of an output codeword of the external decoder to be less than or equal to a target error rate.

Operation S710 is illustrated in detail in FIG. 8, however, according to example embodiments, operations S810 and S820 in FIG. 8 may be similarly applied to operation S730 with respect to the second channel.

The decoding method may estimate an error rate of the ECC-decoded second codeword based on the characteristic of the second channel.

The decoding method may select the second decoding scheme to enable the estimated error rate of the ECC-decoded second codeword to be less than or equal to the threshold error rate of the external decoder.

According to example embodiments, after performing operations S720 and S740, the decoding method may combine the ECC-decoded first codeword and the ECC-decoded second codeword to generate a long codeword. In operation S750, the decoding method may apply the external decoding scheme to the combined long codeword to perform the ECC decoding of the long codeword.

Figure 9:
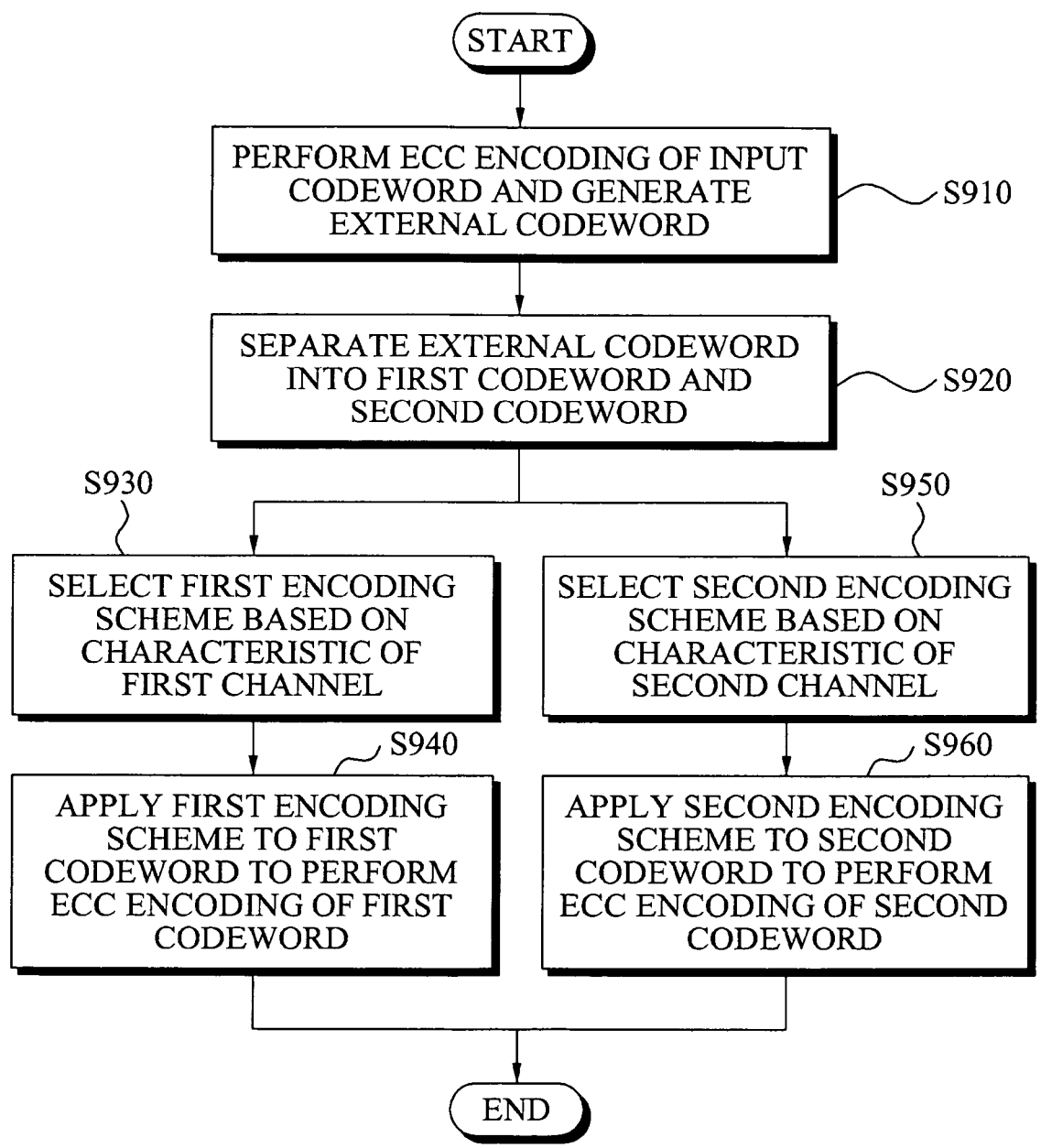
FIG. 9 is a flowchart illustrating an encoding method according to example embodiments.

FIG. 9 is a flowchart illustrating an encoding method according to example embodiments.

Referring to FIG. 9, in operation S910, the encoding method may apply an external encoding scheme to an input codeword to perform ECC encoding of the input codeword, and generate an external codeword. An encoding scheme used to perform the ECC encoding of the input codeword in operation S910 may correspond to an external encoding scheme.

In operation S920, the encoding method may separate the external codeword into a first codeword and a second codeword. The encoding method may bisect the external codeword to separate the external codeword into the first codeword and the second codeword. A length of the second codeword may be the same as a length of the first codeword. Alternatively, the first and second codewords may have different lengths.

In operation S930, the encoding method may select a first encoding scheme based on a characteristic of a first channel. The first channel may correspond to a path in which the first codeword is stored.

In operation S940, the encoding method may apply the first encoding scheme to the first codeword to perform the ECC encoding of the first codeword.

In operation S950, the encoding method may select a second encoding scheme based on a characteristic of a second channel. The second channel may correspond to a path in which the second codeword is stored.

In operation S960, the encoding method may apply the second encoding scheme to the second codeword to perform the ECC encoding of the second codeword.

Data being ECC-encoded by the external encoding scheme may be ECC-decoded by an external decoding scheme and may be restored. The external decoding scheme is a decoding scheme which may correspond to the external encoding scheme. According to example embodiments, the external decoding scheme may correct all errors of the data including the error rate being less than or equal to an error correcting capability.

In operation S930, the encoding method may select the first encoding scheme based on the characteristic of the first channel and the error correcting capability of the external decoding scheme.

In operation S950, the encoding method may select the second encoding scheme based on the characteristic of the second channel and the error correcting capability of the external decoding scheme.

The ECC encoding and/or decoding method according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media may include, for example, magnetic media, for example hard disks, floppy disks, and magnetic tape; optical media, for example CD ROM disks and DVD; magneto-optical media, for example optical disks; and hardware devices that are specially configured to store and perform program instructions, for example read-only memory (ROM), random access memory (RAM), flash memory, and the like. Examples of program instructions include both machine code, for example, produced by a compiler, and files containing higher level code that may be executed by the computer using an interpreter. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages, for example Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In this case, the memory controllers may be constructed to communicate with an external device for example, a host using any one of various types of interface protocols, for example a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that can maintain stored data even when power is cut off. According to an increase in the use of mobile devices, for example a cellular phone, a personal digital assistant (PDA), a digital camera, a portable game console, and an MP3 player, the flash memory devices may be more widely used as data storage and code storage. The flash memory devices may be used in home applications, for example a high definition television (HDTV), a digital video disk (DVD), a router, and a Global Positioning System (GPS).

A computing system according to example embodiments may include a microprocessor that is electrically connected with a bus, a user interface, a modem, for example, a baseband chipset, a memory controller, and a flash memory device. The flash memory device may store N-bit data via the memory controller. The N-bit data may be data that is processed or will be processed by the microprocessor and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory device comprising:
a memory cell array;
an internal decoder configured to apply, to a first codeword read from the memory cell array, a first decoding scheme selected based on a characteristic of a first channel in which the first codeword is read to perform error control codes (ECC) decoding of the first codeword, and apply, to a second codeword read from the memory cell array, a second decoding scheme selected based on a characteristic of a second channel in which the second codeword is read to perform the ECC decoding of the second codeword; and
an external decoder configured to apply an external decoding scheme to the ECC-decoded first codeword and the ECC-decoded second codeword to perform the ECC decoding of the first codeword and the second codeword.

2. The memory device of claim 1, wherein the internal decoder is configured to select an internal decoding scheme to enable a sum of a number of errors of the ECC-decoded first codeword and a number of errors of the ECC-decoded second codeword to be less than or equal to an error correcting capability of the external decoder based on the characteristic of the first channel and the second channel.

3. The memory device of claim 1, wherein the internal decoder is configured to select the first decoding scheme to enable an error rate of the ECC-decoded first codeword to be less than or equal to a threshold error rate based on the characteristic of the first channel, the threshold error rate corresponding to an error rate of an input of the external decoder to enable an output of the external decoder to fulfill a target error rate, and to select the second decoding scheme to enable the error rate of the ECC-decoded second codeword to be less than or equal to the threshold error rate based on the characteristic of the second channel.

4. The memory device of claim 1, wherein the memory cell array includes a plurality of multi-bit cells to store multi-bit data, and
the internal decoder in configured to read the second codeword from the plurality of multi-bit cells in which the first codeword is read.

5. The memory device of claim 1, wherein the internal decoder is configured to select the first decoding scheme and the second decoding scheme to enable an error rate of the ECC-decoded first codeword and the error rate of the ECC-decoded second codeword to be the same.

6. The memory device of claim 1, wherein the internal decoder is configured to combine the ECC-decoded first codeword and the ECC-decoded second codeword to generate a long codeword, and
the external decoder is configured to apply the external decoding scheme to the long codeword to perform the ECC decoding of the long codeword.

7. The memory device of claim 1, wherein the internal decoder includes
a first internal decoding module configured to correspond to the first decoding scheme and perform the ECC decoding of the first codeword; and
a second internal decoding module configured to correspond to the second decoding scheme and perform the ECC decoding of the second codeword.

8. A memory device comprising:
a memory cell array;
an external encoder configured to apply an external encoding scheme to an input codeword to perform ECC encoding of the input codeword, and generate an external codeword;
an internal encoder configured to separate the external codeword into a first codeword and a second codeword, select a first encoding scheme based on a characteristic of a first channel which is associated with the first codeword, apply the first encoding scheme to the first codeword to perform the ECC encoding of the first codeword, select a second encoding scheme based on a characteristic of a second channel which is associated with the second codeword, and apply the second encoding scheme to the second codeword to perform the ECC encoding of the second codeword; and
a programming unit configured to store the ECC-encoded first codeword and the ECC-encoded second codeword in the memory cell array.

9. The memory device of claim 8, wherein the internal encoder in configured to select the first encoding scheme based on the characteristic of the first channel and an error correcting capability of an external decoding scheme corresponding to the external encoding scheme, and to select the second encoding scheme based on the characteristic of the second channel and the error correcting capability of the external decoding scheme.

10. The memory device of claim 8, wherein the memory cell array includes a plurality of multi-bit cells to store multi-bit data, and
the programming unit is configured to store the ECC-encoded second codeword in the plurality of multi-bit cells storing the ECC-encoded first codeword.

11. The memory device of claim 8, wherein the internal encoder includes a first internal encoding module configured to correspond to the first encoding scheme and perform the ECC encoding of the first codeword; and
a second internal encoding module configured to correspond to the second encoding scheme and perform the ECC encoding of the second codeword.

12. The memory device of claim 8, wherein the internal encoder in configured to set a size of valid information and redundant information of the first codeword based on the first encoding scheme to perform the ECC encoding of the first codeword, and to set the size of the valid information and the redundant information of the second codeword based on the second encoding scheme to perform the ECC encoding of the second codeword.

13. The memory device of claim 8, wherein the internal encoder is configured to apply a scheme of at least one of an extended code, a shortened code, and a punctured code to the first codeword or the second codeword, and to adjust a size of valid information or redundant information of the first codeword or the second codeword.

14. A decoding method of a concatenated decoder including an internal decoder and an external decoder, the method comprising:
selecting a first decoding scheme based on a characteristic of a first channel;
applying the first decoding scheme to a first codeword received through the first channel to perform ECC decoding of the first codeword;
selecting a second decoding scheme based on a characteristic of a second channel;
applying the second decoding scheme to a second codeword received through the second channel to perform the ECC decoding of the second codeword; and
applying an external decoding scheme to the ECC-decoded first codeword and the ECC-decoded second codeword to perform the ECC decoding of the first codeword and the second codeword.

15. The method of claim 14, wherein the selecting of the first decoding scheme comprises:
estimating an error rate of the ECC-decoded first codeword based on the characteristic of the first channel; and
selecting the first decoding scheme to enable the estimated error rate to be less than or equal to a threshold error rate of the external decoder, the threshold error rate corresponding to an error rate of an input of the external decoder to enable an output of the external decoder to fulfill a target error rate.

16. The method of claim 14, wherein the selecting of the second decoding scheme comprises:
estimating an error rate of the ECC-decoded second codeword based on the characteristic of the second channel; and
selecting the second decoding scheme to enable the estimated error rate to be less than or equal to a threshold error rate of the external decoder.

17. The method of claim 14, further comprising:
combining the ECC-decoded first codeword and the ECC-decoded second codeword to generate a long codeword,
wherein the applying of the external decoding scheme to perform the ECC decoding of the first codeword and the second codeword applies the external decoding scheme to the long codeword to perform the ECC decoding of the long codeword.

18. A computer-readable recording medium storing a program for implementing the method of any one of claim 14.

19. An encoding method comprising:

applying an external encoding scheme to an input codeword to perform ECC encoding of the input codeword, and generating an external codeword;

separating the external codeword into a first codeword and a second codeword;

selecting a first encoding scheme based on a characteristic of a first channel in which the first codeword is stored;

applying the first encoding scheme to the first codeword to perform the ECC encoding of the first codeword;

selecting a second encoding scheme based on a characteristic of a second channel in which the second codeword is stored; and applying the second encoding scheme to the second codeword to perform the ECC encoding of the second codeword.

20. The method of claim 19, wherein the selecting of the first encoding scheme selects the first encoding scheme based on the characteristic of the first channel and an error correcting capability of an external decoding scheme corresponding to the external encoding scheme, and the selecting of the second encoding scheme selects the second encoding scheme based on the characteristic of the second channel and the error correcting capability of the external decoding scheme.

21. A computer-readable recording medium storing a program for implementing the method of any one of claim 19.

* * * * *